(12) United States Patent
Mikalo et al.

(10) Patent No.: US 8,536,019 B2
(45) Date of Patent: Sep. 17, 2013

(54) SEMICONDUCTOR DEVICES HAVING ENCAPSULATED ISOLATION REGIONS AND RELATED FABRICATION METHODS

(75) Inventors: Ricardo P. Mikalo, Heideblick (DE); Frank W. Wirbeleit, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 80 days.

(21) Appl. No.: 13/109,869

(22) Filed: May 17, 2011

(65) Prior Publication Data

US 2012/0292734 A1 Nov. 22, 2012

(51) Int. Cl.
*H01L 21/76* (2006.01)
*H01L 29/06* (2006.01)

(52) U.S. Cl.
USPC ............... 438/435; 438/221; 438/225

(58) Field of Classification Search
USPC ................ 438/218–232, 435–453
See application file for complete search history.

(56) References Cited

U.S. PATENT DOCUMENTS

| 5,994,200 | A | 11/1999 | Kim |
| 6,720,638 | B2 | 4/2004 | Tran |
| 6,744,113 | B2 * | 6/2004 | Kuroi et al. ............ 438/221 |
| 7,560,781 | B2 | 7/2009 | Gotoh et al. |
| 2003/0013272 | A1 | 1/2003 | Hong et al. |
| 2006/0220142 | A1 | 10/2006 | Tamura |
| 2009/0283852 | A1 | 11/2009 | Gutmann et al. |

OTHER PUBLICATIONS

First Office Action mailed Apr. 4, 2013 in related German Patent Application No. 10 2012 206 998.4.

* cited by examiner

*Primary Examiner* — Cuong Q Nguyen
(74) *Attorney, Agent, or Firm* — Ingrassia Fisher & Lorenz, P.C.

(57) ABSTRACT

Apparatus and related fabrication methods are provided for semiconductor device structures having encapsulated isolation regions. An exemplary method for fabricating a semiconductor device structure involves the steps of forming an isolation region of a first dielectric material in the semiconductor substrate adjacent to a first region of the semiconductor material, forming a first layer of a second dielectric material overlying the isolation region and the first region, and removing the second dielectric material overlying the first region leaving portions of the second dielectric material overlying the isolation region intact. The isolation region is recessed relative to the first region, and the second dielectric material is more resistant to an etchant than the first dielectric material.

13 Claims, 7 Drawing Sheets

SEMICONDUCTOR DEVICES HAVING ENCAPSULATED ISOLATION REGIONS AND RELATED FABRICATION METHODS

TECHNICAL FIELD

Embodiments of the subject matter generally relate to semiconductor device structures and related fabrication methods, and more particularly, embodiments of the subject matter relate to devices formed on electrically isolated regions of semiconductor material and related fabrication methods.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry. Increasing density necessarily involves reducing the area between neighboring devices, which in turn, requires reliable isolation between devices to prevent leakage currents, parasitic capacitances, and other undesirable electrical effects that may degrade performance and/or reduce yield.

BRIEF SUMMARY

A method is provided for fabricating a semiconductor device on a semiconductor substrate of a semiconductor material. The method involves the steps of forming an isolation region of a first dielectric material in the semiconductor substrate adjacent to a first region of the semiconductor material, forming a first layer of a second dielectric material overlying the isolation region and the first region, and removing the second dielectric material overlying the first region leaving portions of the second dielectric material overlying the isolation region intact. The isolation region is recessed relative to the first region, and the second dielectric material is more resistant to an etchant than the first dielectric material.

In another embodiment, a method of fabricating a semiconductor device structure on a semiconductor substrate of a semiconductor material involves the steps of forming an oxide isolation region adjacent to a first region of the semiconductor material, conformably depositing a nitride material overlying the first region and the oxide isolation region, and removing the nitride material overlying the first region leaving a portion of the nitride material overlying the oxide isolation region intact. The oxide isolation region is recessed relative to the first region.

In another embodiment, another apparatus for a semiconductor device is provided. The semiconductor device includes an active region of semiconductor material having a transistor structure formed thereon, an oxide isolation region adjacent to the active region of semiconductor material, the oxide isolation region being recessed relative to the active region, and a dielectric capping material overlying the oxide isolation region. The dielectric capping material is more resistant to an etchant than the oxide isolation region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices on electrically isolated regions of a semiconductor substrate. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of semiconductor devices are well known and so, in the interest of brevity, many conventional steps will only be mentioned briefly herein or will be omitted entirely without providing the well known process details.

Figure 1:
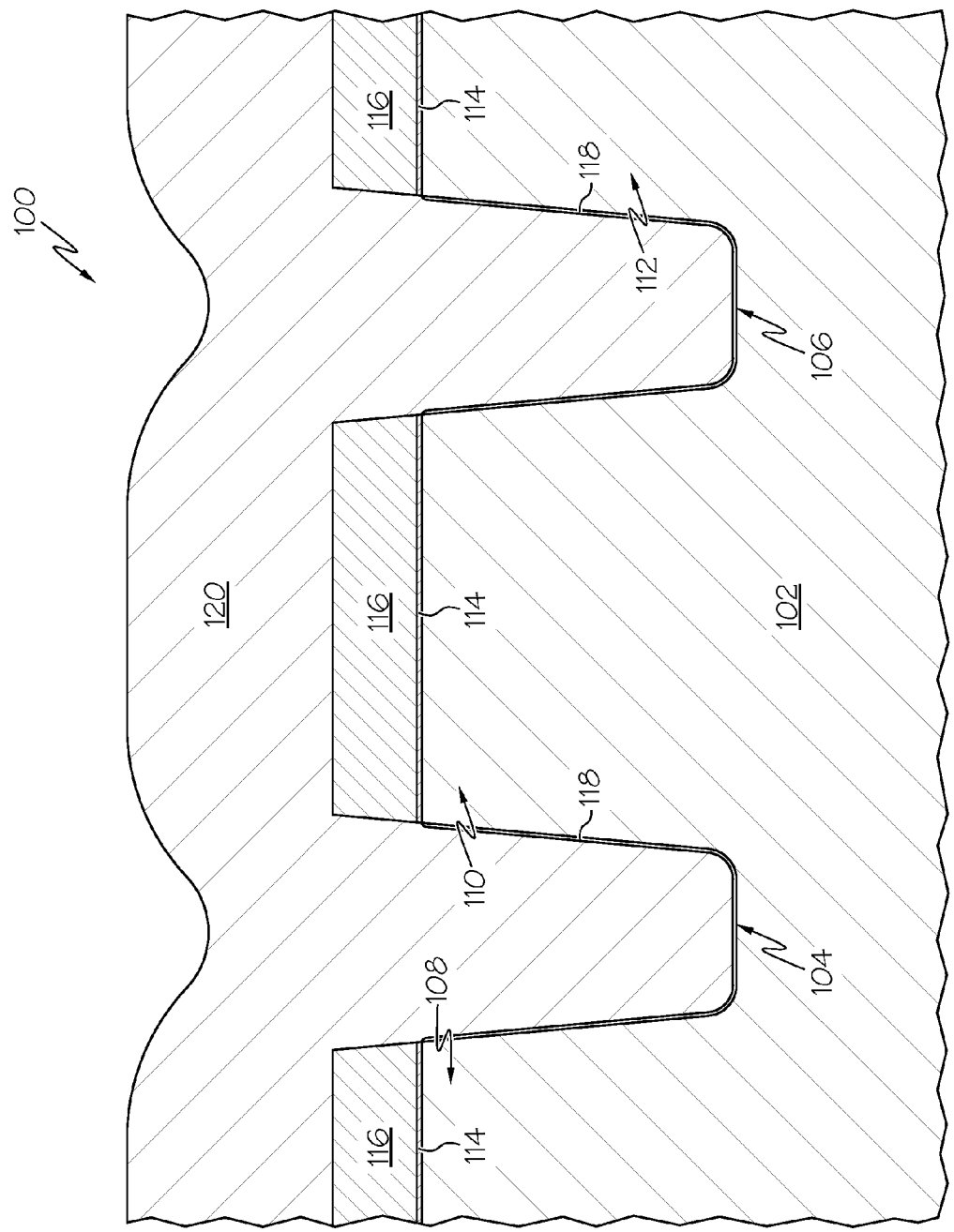
FIGS. 1-7 are cross-sectional views that illustrate a semiconductor device structure and methods for fabricating the semiconductor device structure in exemplary embodiments.
Figure 2:
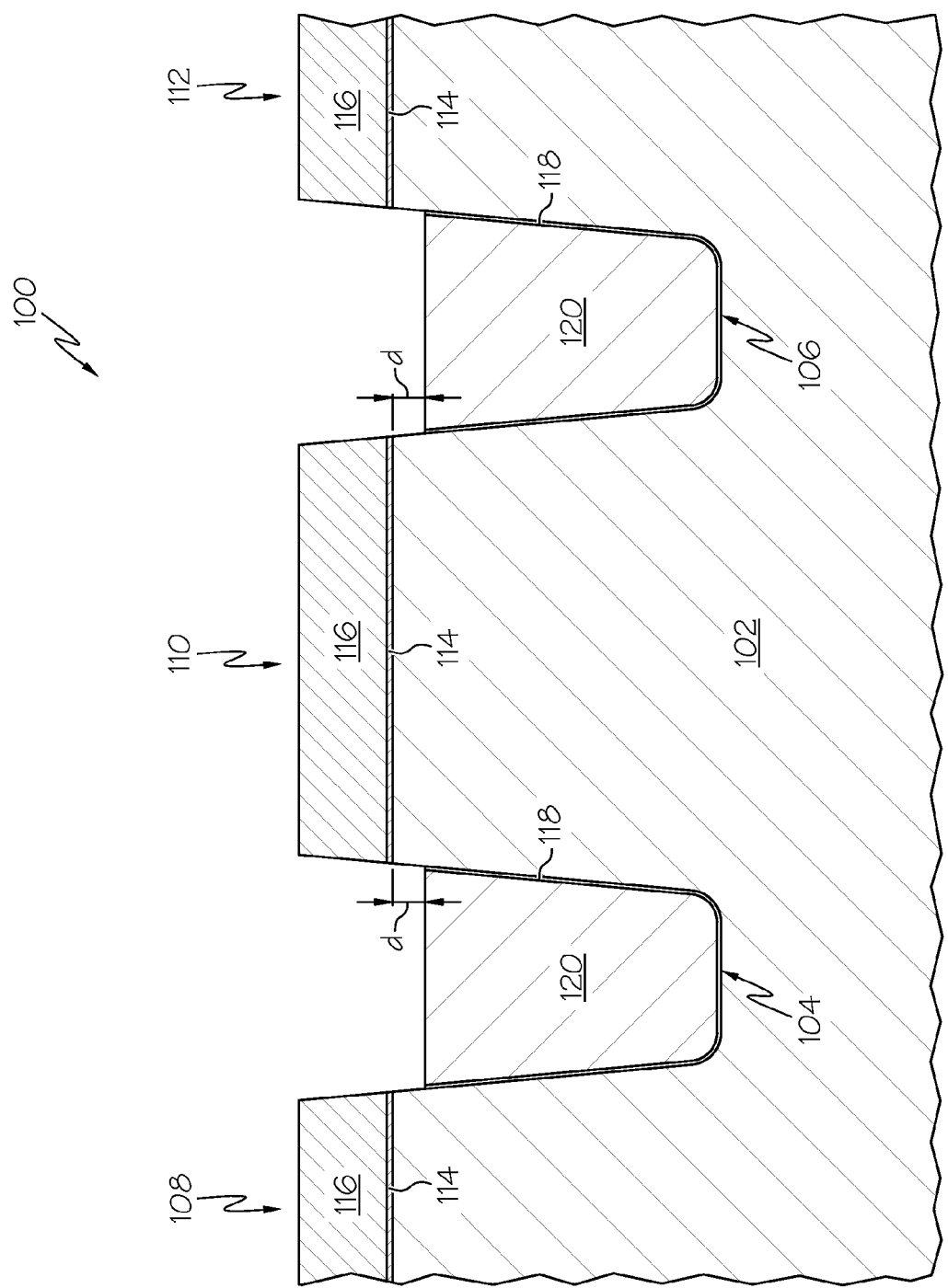

FIGS. 1-7 illustrate a semiconductor device structure 100 and process steps for fabricating the same. Referring now to FIGS. 1-2, in an exemplary embodiment, fabrication of the semiconductor device structure 100 begins by providing an appropriate substrate of semiconductor material 102 and forming oxide isolation regions 104, 106 in the semiconductor substrate 102 to obtain electrically isolated regions 108, 110, 112 of semiconductor material 102. As described in greater detail below, the electrically isolated regions 108, 110, 112 may be doped in a conventional manner and utilized to form electrically isolated transistor devices or other devices. Accordingly, for convenience, but without limitation, the electrically isolated regions 108, 110, 112 may alternatively be referred to herein as active regions.

In an exemplary embodiment, the semiconductor substrate 102 is realized as a bulk semiconductor substrate comprising a silicon material, wherein the term "silicon material" is used herein to encompass the relatively pure silicon materials typically used in the semiconductor industry as well as silicon admixed with other elements such as germanium, carbon, and the like. Alternatively, the semiconductor material 102 can be realized as germanium, gallium arsenide, and the like, or the semiconductor material 102 can include layers of different semiconductor materials. Additionally, it should be noted that although the fabrication process may be described herein in the context of a bulk semiconductor substrate, the subject matter is not intended to be limited to bulk semiconductor substrates, and in practice, the fabrication process may utilize a silicon-on-insulator (SOI) substrate in an equivalent manner with corresponding modifications to the relative dimensions described below to accommodate the thickness of the silicon of the SOI substrate.

In an exemplary embodiment, the electrically isolated regions 108, 110, 112 are formed by performing shallow trench isolation (STI) on the semiconductor substrate. In the illustrated embodiment, a layer of oxide material 114 (alternatively referred to herein as the pad oxide) is formed overlying the semiconductor material 102, and a layer of masking material 116 is formed overlying the oxide material 114. In an exemplary embodiment, the layer of oxide material 114 is relatively thin, typically less than about 10 nanometers (nm) and preferably around 5 nm or less, and the oxide material 114 may be thermally grown or deposited on the exposed surfaces of the semiconductor substrate 102 in a conventional manner. The layer of masking material 116 is formed by conformably depositing a hard mask material, such as a nitride material (e.g., silicon nitride, silicon oxynitride, or the like) overlying the layer of oxide material 114 to a thickness in the range of about 80 nm. A nitride material, such as silicon nitride, is preferable because it accommodates the selective etching of underlying semiconductor material 102 when subsequently used as an etch mask. Accordingly, the portions of the masking material 116 overlying the active regions 108, 110, 112 may hereinafter be referred to for convenience, but without limitation, as the pad nitride. The pad nitride 116 is patterned to mask the desired active regions 108, 110, 112 of semiconductor material 102, and an anisotropic etchant is utilized to remove exposed (or unprotected) portions of the pad oxide 114 and the semiconductor material 102 to form trenches between the active regions 108, 110, 112. Although not illustrated in FIG. 1, the trenches may be formed about the perimeters of the active regions 108, 110, 112 or otherwise circumscribe the active regions 108, 110, 112 to physically isolate neighboring active regions 108, 110, 112. The trenches are etched to a depth that exceeds the depth of any body regions (or well regions) subsequently formed in the active regions 108, 110, 112. For example, in accordance with one embodiment, the trenches are etched to a depth of about 300 nm relative to the upper surface of the semiconductor material 102.

After forming trenches, in an exemplary embodiment, a layer of oxide material 118 is formed on exposed surfaces of semiconductor material 102 in the trenches. For example, the oxide material 118 may be thermally grown on the exposed surfaces of the trenches by exposing the semiconductor substrate 102 to an oxidizing ambient at an elevated temperature that promotes selective growth of oxide material, such as silicon dioxide, on the exposed surfaces of the semiconductor material 102. In an exemplary embodiment, the layer of oxide material 118 is relatively thin, and preferably, is formed to a thickness of about 5 nm or less. In one embodiment, the thickness of the oxide material 118 is within the range of about 3 nm to 4 nm.

After forming the layer of oxide material 118 in the trenches, the fabrication process continues by forming a second layer of oxide material 120 in the trenches and overlying the semiconductor substrate 102, resulting in the semiconductor device structure 100 illustrated in FIG. 1. The second layer of oxide material 120 is preferably formed by conformably depositing an oxide material, such as silicon dioxide, using a plasma enhanced chemical vapor deposition (PECVD) process or another suitable deposition process. In this regard, the oxide material 120 may be realized as high aspect ratio plasma (HARP) oxide. In an exemplary embodiment, the oxide material 120 is deposited to a thickness that is greater than or equal to the depth of the trenches and is subsequently reduced to a height below the upper surfaces of the semiconductor material 102 of the active regions 108, 110, 112, as described in greater detail below. For example, in accordance with one embodiment, the trenches are etched to a depth of about 300 nm relative to the surface of the semiconductor material 102, and the thickness of the layer of oxide material 120 is within the range of about 300 nm to about 500 nm. In alternative embodiments, however, the oxide material 120 may be deposited to a thickness that is less than the depth of the trenches. For example, in accordance with one alternative embodiment, the trenches are etched to a depth of about 300 nm relative to the surface of the semiconductor material 102, and the thickness of the layer of oxide material 120 is within the range of about 250 nm to about 300 nm.

After forming the oxide materials 118, 120 in the trenches, the fabrication process continues by removing portions of the oxide material 120 overlying the active regions 108, 110, 112, resulting in the semiconductor device structure 100 of FIG. 2. In an exemplary embodiment, the fabrication process polishes the oxide material 120 to remove portions of the oxide material 120 across the semiconductor substrate 102 until reaching the upper surfaces of the pad nitride 116. In accordance with one embodiment, chemical-mechanical planarization (CMP) is used to polish the oxide material 120 with a chemical slurry for a predetermined amount of time such that the CMP stops when the upper surfaces of the pad nitride 116 are exposed. In other words, the fabrication process ceases planarizing the oxide material 120 when the pad nitride 116 is reached. In this manner, the portions of the oxide material 120 overlying the active regions 108, 110, 112 are uniformly removed until the upper surfaces of the underlying pad nitride 116 are exposed. The remaining portions of oxide material 118, 120 in the trenches between the active regions 108, 110, 112 provide the oxide isolation regions 104, 106 that electrically isolate neighboring active regions 108, 110, 112.

As illustrated in FIG. 2, in an exemplary embodiment, the oxide isolation regions 104, 106 are recessed relative to the active regions 108, 110, 112 by a depth (d) corresponding to the distance between the upper surfaces of the oxide material 120 in the trenches and the upper surfaces of the semiconductor material 102 of the active regions 108, 110, 112. In an exemplary embodiment, the distance (d) between the upper surfaces of the oxide material 120 and the upper surfaces of the semiconductor material 102 is within the range of about five percent to about twenty percent of the depth of the trench. For example, in accordance with one embodiment, the trenches are etched to a depth of about 300 nm relative to the surface of the semiconductor material 102, and the distance (d) between the upper surfaces of the oxide material 120 and the upper surfaces of the semiconductor material 102 is within the range of about 20 nm to about 50 nm. In this regard, if the thickness of the layer of oxide material 120 exceeds the thickness of the trenches such that distance between the upper surfaces of the oxide material 120 in the trenches after the CMP process and the upper surfaces of the semiconductor material 102 is less than the desired distance (d), an additional etch process step may be performed after the CMP to reduce the height of the oxide material 120 in the trenches and provide the desired distance (d) between the upper surfaces of the oxide material 120 and the upper surfaces of the semiconductor material 102. For example, in accordance with one or more embodiments, after performing CMP to remove the oxide material 120 overlying the active regions 108, 110, 112, excess oxide material 120 in the trenches is removed by performing an anisotropic etch process to remove portions of the oxide material 120 in the trenches to provide the desired recessed depth (d) of the oxide isolation regions 104, 106 relative to the active regions 108, 110, 112. For example, plasma-based RIE may be performed using an anisotropic etchant that anisotropically etches the oxide material 120 with good selectivity to the pad nitride 116 until the distance between the upper surfaces of the oxide material 120 and the upper surfaces of the semiconductor material 102 is within the range of about five percent to about twenty percent of the depth of the trench. In this regard, the etch process step may be performed without any masking or other photolithography steps, as the remaining pad nitride 116 protects the underlying semiconductor material 102 of the active regions 108, 110, 112 from exposure to the etchant while portions of the oxide material 120 are removed. In other embodiments, the CMP process used to remove portions of the oxide material 120 overlying the active regions 108, 110, 112 may be modified to concurrently remove portions of the oxide material 120 in the trenches at a rate that provides the desired depth (d) relative to the upper surfaces of the semiconductor material 102.

Figure 3:
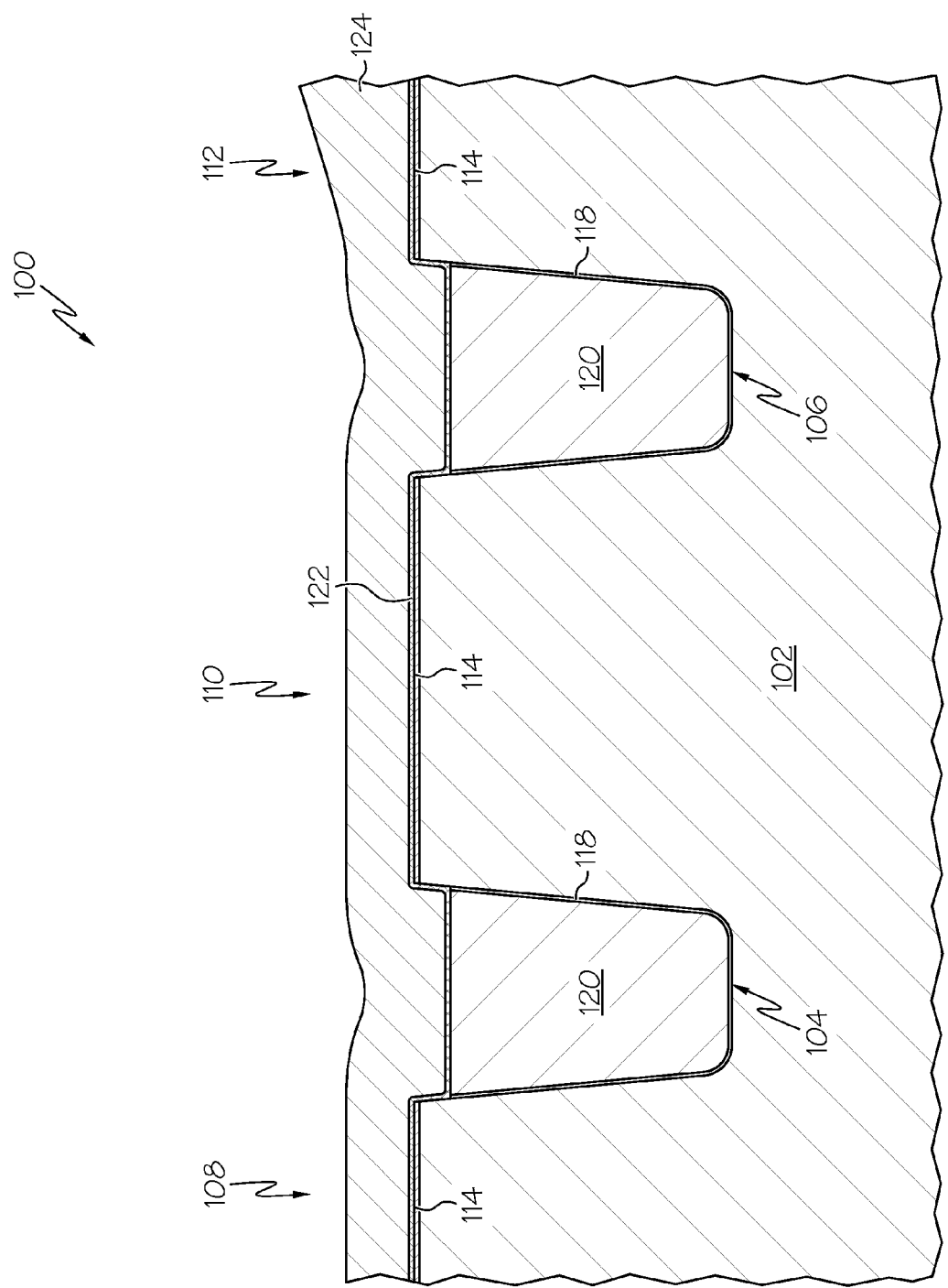

Referring now to FIG. 3, in an exemplary embodiment, the fabrication process continues by removing the pad nitride 116, forming a layer of dielectric material 122 overlying the active regions 108, 110, 112 and the isolation regions 104, 106, and forming another layer of dielectric material 124 overlying the layer of dielectric material 122. In an exemplary embodiment, the layer of dielectric material 122 is realized as a layer of an oxide material, such as silicon dioxide, that is conformably deposited overlying the semiconductor device structure 100 of FIG. 1, for example, by using a low-pressure chemical vapor deposition (LPCVD) process or another suitable deposition process. For convenience, but without limitation, the dielectric material 122 may be referred to herein as an oxide material. The thickness of the oxide material 122 is less than the recessed depth (d) of the upper surfaces of the isolation regions 104, 106 relative to the upper surfaces of the active regions 108, 110, 112, and is preferably less than about twenty-five percent of the recessed depth (d) of the isolation regions 104, 106. For example, in accordance with one embodiment, the distance (d) between the upper surfaces of the oxide material 120 and the upper surfaces of the semiconductor material 102 is within the range of about 20 nm to about 50 nm, and the thickness of the oxide material 122 is about 5 nm or less. Preferably, the layer of oxide material 122 is as thin as possible, as described in greater detail below.

In an exemplary embodiment, the dielectric material 124 is realized as a material that is more resistant to one or more etchants than the oxide material 118, 120 of the isolation regions 104, 106. In an exemplary embodiment, the dielectric material 124 is more resistant to hydrofluoric acid and/or hydrofluoric acid-comprising etchants than the oxide material 118, 120 of the isolation regions 104, 106, that is, hydrofluoric acid etches the dielectric material 124 at a reduced rate relative to the oxide material 118, 120. In an exemplary embodiment, the hydrofluoric acid resistant dielectric material 124 is realized as a nitride material, such as silicon nitride. It should be noted that other materials having the same general properties and characteristics could be used as the hydrofluoric acid resistant dielectric material 124 in lieu of silicon nitride. That said, silicon nitride is commonly used for other purposes in semiconductor manufacturing processes, is accepted for use in the industry, and is well documented. Accordingly, preferred embodiments employ silicon nitride for the hydrofluoric acid resistant dielectric material 124, and the hydrofluoric acid resistant dielectric material 124 may alternatively be referred to herein as a nitride material. In the illustrated embodiment, after forming the layer of oxide material 122, the layer of nitride material 124 is formed by conformably depositing silicon nitride overlying the oxide material 122 using an LPCVD process or another suitable deposition process. As described in greater detail below, the nitride material 124 functions as a capping material that encapsulates the upper surface of the oxide isolation regions 104, 106 and protects the oxide material 118, 120 from exposure to hydrofluoric acid and/or other etchant chemistries that may otherwise remove the oxide material 118, 120. In this regard, the deposited thickness of the nitride material 124 is greater than the recessed depth (d) of the isolation regions 104, 106 relative to the semiconductor material 102 of the active regions 108, 110, 112. In an exemplary embodiment, the thickness of the nitride material 124 is at least twice the recessed depth (d) of the isolation regions 104, 106 relative to the upper surfaces of the semiconductor material 102 of the active regions 108, 110, 112 (e.g., a thickness of the nitride material 124 of 2d). For example, in accordance with one embodiment, the distance (d) between the upper surfaces of the oxide material 120 and the upper surfaces of the semiconductor material 102 is within the range of about 20 nm to about 50 nm and the thickness of the nitride material 124 is within the range of about 40 nm to about 100 nm. As described in greater detail below, after subsequent process steps, the nitride material 124 overlying the isolation regions 104, 106 is preferably reduced to a thickness substantially equal to the recessed depth (d) of the isolation regions 104, 106.

Figure 4:
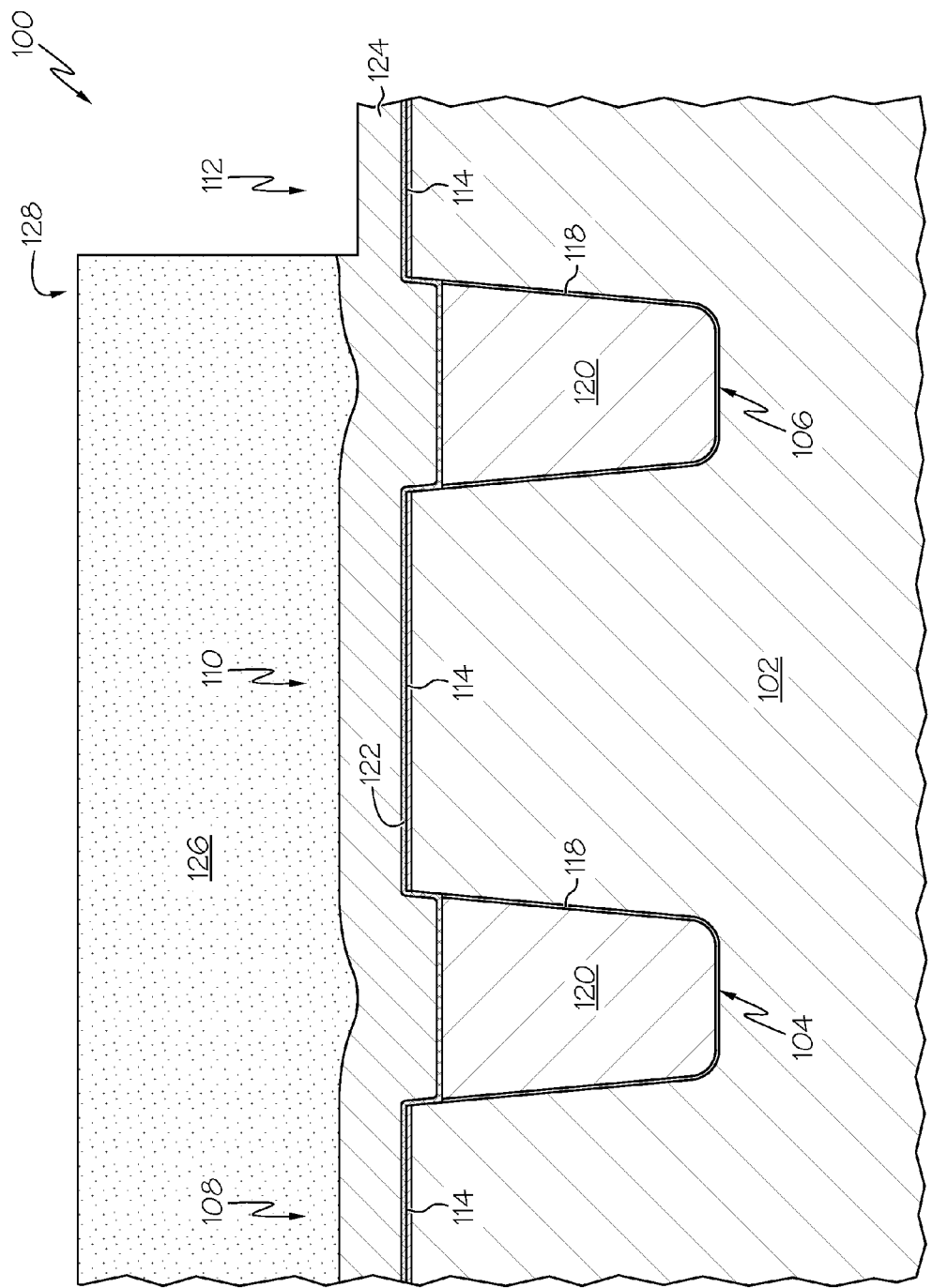

Referring now to FIG. 4, in accordance with one or more embodiments, the fabrication process continues by masking portions of the nitride material 124 overlying the isolation regions 104, 106 and removing portions of the layer of nitride material 124 overlying any large active regions. In this regard, a large active region should be understood as referring to an electrically isolated region of semiconductor material 102 having an area of about 400 square microns or more. For example, in the illustrated embodiment, the semiconductor device structure 100 includes a large active region 112 that may be utilized for fabricating thereon multiple transistor devices that do not need isolation, a transistor device that is larger than those fabricated on active regions 108, 110, or another component, such as a MOS capacitor, a diode, or the like. As illustrated in FIG. 3, in practice, the conformal deposition of the nitride material 124 may be non-uniform by virtue of the topographical variations between small active regions 108, 110 and large active regions 112, resulting in the portions of the nitride material 124 overlying the large active region 112 being thicker than the nitride material 124 overlying the smaller active regions 108, 110. In this regard, reducing the thickness of the nitride material 124 overlying the large active region 112 may improve subsequent process steps, such as the planarization of the nitride material 124 described below. To remove portions of the nitride material 124, a masking material 126 is formed overlying the semiconductor device structure 100 of FIG. 3 and patterned to define an etch mask 128 that exposes portions of the nitride material 124 overlying the large active region 112. In this regard, the portions of the masking material 126 overlying the isolation regions 104, 106 and the relatively smaller active regions 108, 110 remain intact. As illustrated, in an exemplary embodiment, portions of the masking material 126 that overlie portions of the large active region 112 adjacent to or otherwise bordering the isolation region 106 remain intact such that the mask 128 overlaps the periphery of the large active region 112 to ensure that any portions of the nitride material 124 overlying the adjacent isolation region 106 are not removed when the nitride material 124 overlying the large active region 112 is removed. After forming the mask 128, the exposed portions of the nitride material 124 are removed by performing RIE to anisotropically etch the exposed nitride material 124 with an anisotropic etchant chemistry using the etch mask 128. As illustrated in FIG. 4, in an exemplary embodiment, the exposed nitride material 124 overlying the large active region 112 is etched until the upper surface of the exposed nitride material 124 overlying the large active region 112 is substantially aligned with the upper surfaces of the nitride material 124 overlying the isolation regions 104, 106. In this regard, variations in the thickness of the nitride material 124 relative to the upper surfaces of the semiconductor material 102 that may result from the conformal deposition on large areas (e.g., active region 112) relative to smaller areas (e.g., active regions 108, 110) may be reduced. After removing portions of the exposed nitride material 124 overlying the large active region 112 such that the nitride material 124 overlying the active region 112 is substantially aligned with the nitride material 124 overlying the isolation regions 104, 106, any remaining masking material 126 is removed.

Figure 5:
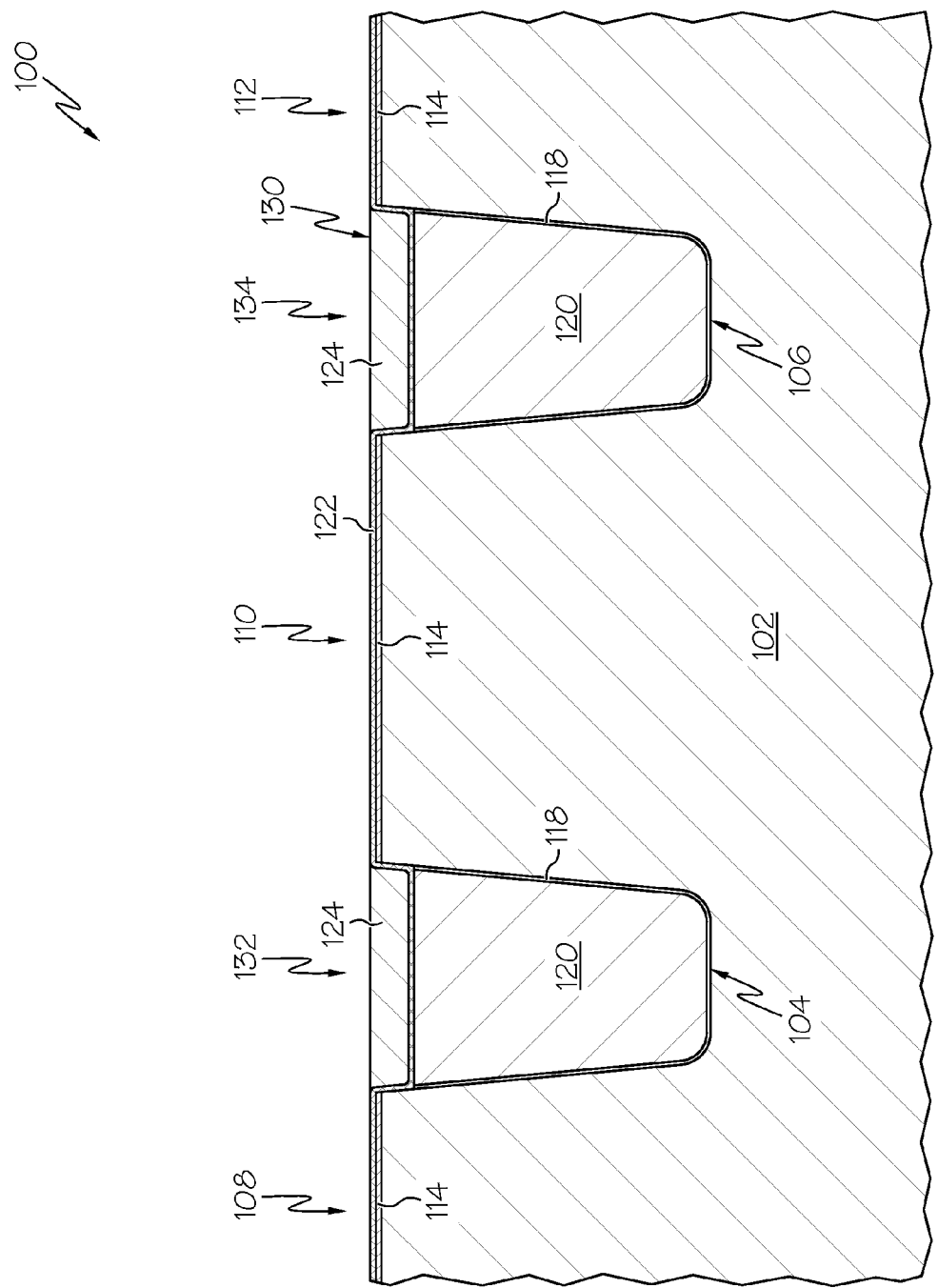
Figure 6:
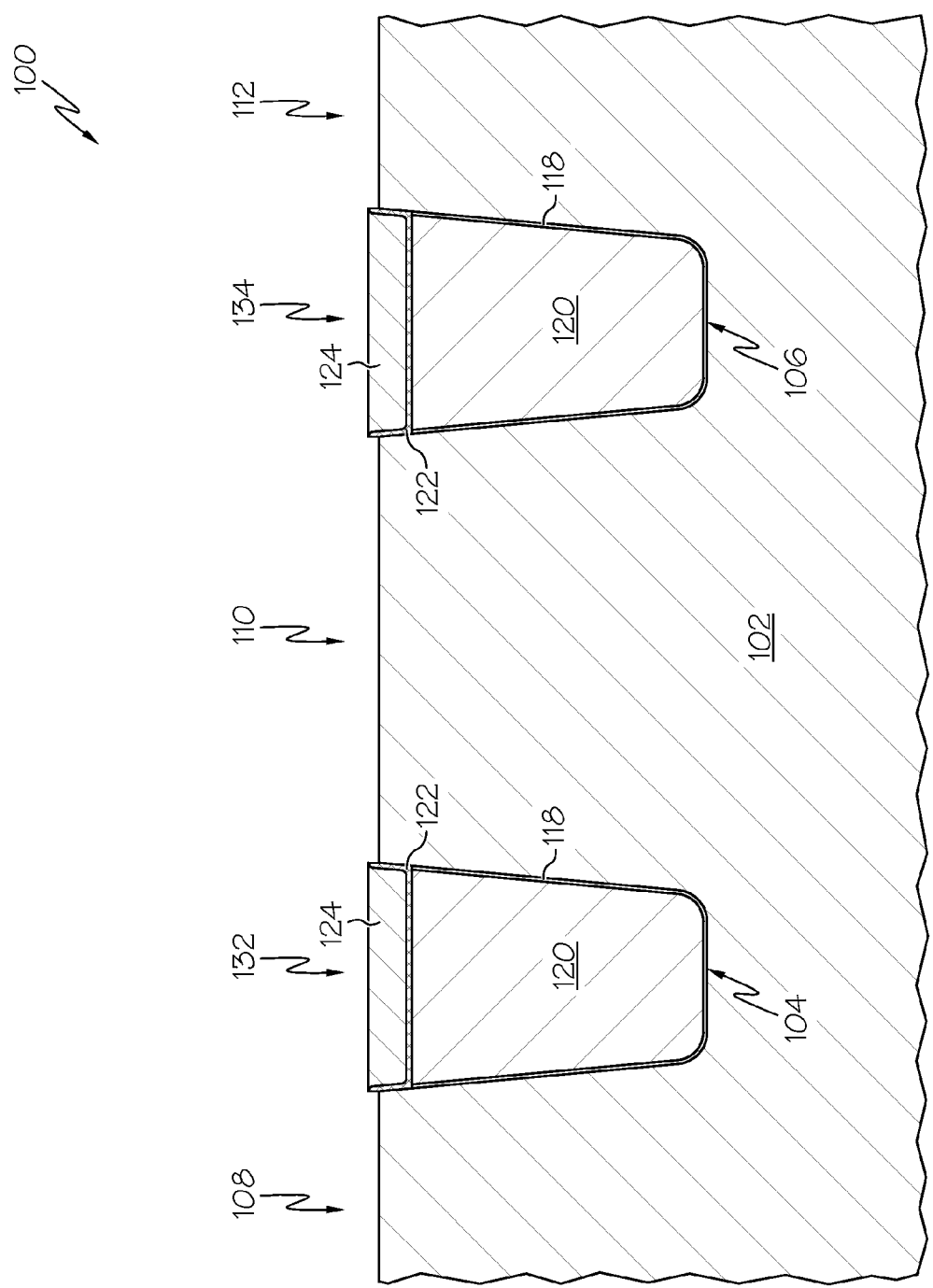

Referring now to FIGS. 5-6, in an exemplary embodiment, the fabrication process continues by removing portions of the nitride material 124 to obtain a substantially planar surface 130 that is aligned with the upper surface of the oxide material 122, resulting in the semiconductor device structure 100 illustrated by FIG. 5. In an exemplary embodiment, the fabrication process planarizes the nitride material 124 to remove portions of the nitride material 124 across the semiconductor substrate 102 until reaching the upper surface of the oxide material 122. In other words, the fabrication process ceases planarizing the nitride material 124 when the upper surfaces of the oxide material 122 are exposed. In accordance with one embodiment, CMP is used to polish the nitride material 124 with a chemical slurry for a predetermined amount of time such that the CMP stops when the upper surfaces of the oxide material 122 are exposed. As illustrated in FIG. 5, when the upper surfaces of the oxide material 122 are exposed, the nitride material 124 is completely removed from the active regions 108, 110, 112, while portions of the nitride material 124 overlying the isolation regions 104, 106 remain intact and provide hydrofluoric acid resistant caps 132, 134 that encapsulate the upper surfaces of the oxide isolation regions 104, 106.

After removing the nitride material 124 overlying the active regions 108, 110, the fabrication process continues by removing exposed portions of the oxide material 122 and the pad oxide 114 overlying the active regions 108, 110, 112 to obtain the semiconductor device structure 100 illustrated by FIG. 6. In an exemplary embodiment, a diluted hydrofluoric acid etching process or another known etching process is performed to remove exposed oxide material 114, 122 until the upper surfaces of the semiconductor material 102 of the active regions 108, 110, 112 are exposed. In this regard, the nitride material 124 of the hydrofluoric acid resistant caps 132, 134 protects the underlying oxide material 118, 120, 122 from the etchant while the oxide material 114, 122 is removed from the active regions 108, 110, 112.

By virtue of the layer of oxide material 122 being relatively thin (e.g., about 5 nm or less) in addition to the pad oxide 114 being relatively thin (e.g., about 5 nm or less), the difference between the upper surfaces of the nitride caps 132, 134 relative to the upper surfaces of the surrounding semiconductor material 102 of the active regions 108, 110, 112 is relatively small and corresponds to the combined thicknesses of the oxide layer 122 and the pad oxide 114 (e.g., about 10 nm or less), thereby reducing the topographical variations across the semiconductor substrate 102. Thus, reducing the thickness of the oxide layer 122 and/or pad oxide 114 results in upper surfaces of the nitride caps 132, 134 that are more closely aligned with the upper surfaces of the active regions 108, 110, 112, and accordingly, in exemplary embodiments, the oxide layer 122 is as thin as possible. The pad oxide 114 is also preferably as thin as possible; however, it will be appreciated that the thickness of the pad oxide 114 may be constrained by other process steps (e.g., the process steps for etching the trenches for the isolation regions 104, 106). It should be noted that in embodiments where it is desirable to provide a highly planar surface across the semiconductor substrate, the fabrication process may continue by performing one or more etch steps or planarization steps to reduce the height of the nitride caps 132, 134 until they are substantially aligned with the adjacent semiconductor material 102 of the active regions 108, 110, 112.

Figure 7:
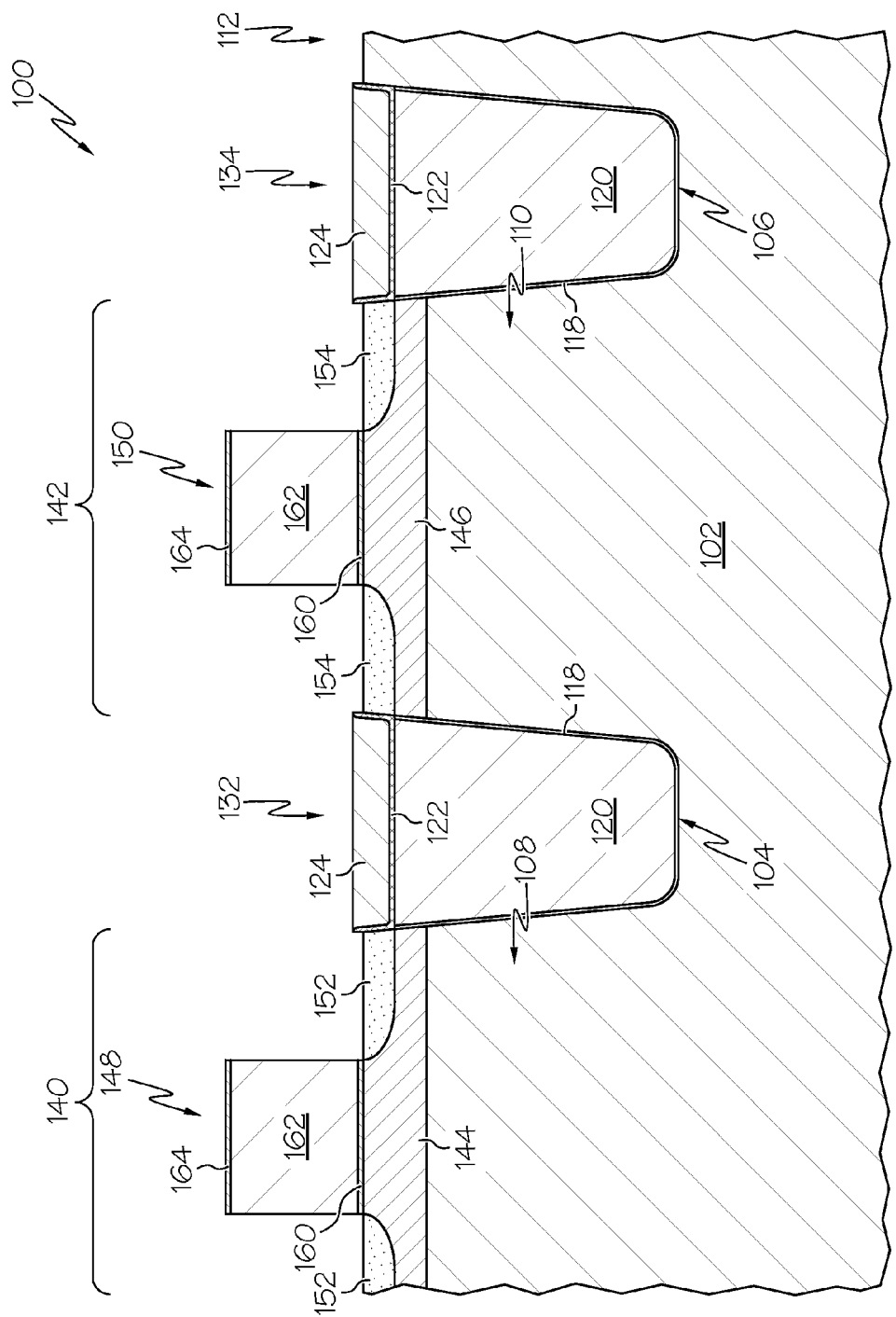

Referring now to FIG. 7, although one or more additional process steps may be performed next, in the illustrated embodiment, transistor structures 140, 142 are formed on the smaller active regions 108, 110. In this regard, the fabrication process continues forming body regions (or well regions) 144, 146 for the transistor structures 140, 142 in the active regions 108, 110, forming gate structures 148, 150 overlying the well regions 144, 146, and forming spaced-apart source and drain regions 152, 154 about the gate structures 148, 150. The body regions 144, 146 may be formed by doping the active regions 108, 110 in a conventional manner, for example, by implanting ions of a desired conductivity-determining impurity type, to achieve a desired dopant profile for the transistor structures 140, 142. As described above, the depth of the body regions 144, 146 relative to the upper surfaces of the semiconductor material 102 is less than the depth of the trenches (or isolation regions 104, 106), such that the body regions 144, 146 are electrically isolated by the isolation regions 104, 106. The gate structures 148, 150 function as gate electrodes for the respective transistor structures 140, 142, and may be fabricated using a conventional gate stack module or any combination of well-known process steps. The gate structures 148, 150 preferably include at least one layer of dielectric material 160, at least one layer of conductive gate electrode material 162, and at least one layer of a dielectric capping material 164. In accordance with one embodiment, the gate structures 148, 150 are formed by depositing one or more layers of high-k dielectric material 160 overlying the semiconductor material 102, depositing one or more layers of metal material 162 overlying the high-k dielectric material(s) 160, and depositing one or more layers of dielectric material 164, such as a nitride material (e.g., silicon nitride, silicon oxynitride, or the like), overlying the metal material 164, and selectively removing portions of the high-k dielectric material 160, metal material 162, and capping material 164, preferably using an anisotropic etchant, to define the gate structures 148, 150. The remaining portions of the capping material 164 function as gate caps that protect the underlying metal material 162 during subsequent process steps. It should be understood that various numbers, combinations and/or arrangements of materials may be utilized for the gate structure in a practical embodiment, and the subject matter described herein is not limited to any particular number, combination, or arrangement of gate material(s) in the gate structure.

After the gate structures 148, 150 are formed, spaced-apart source and drain regions 152, 154 may be formed about the gate structures 148, 150 by implanting dopant ions of a conductivity-determining impurity type into the semiconductor material 102 to a desired depth and/or sheet resistivity using the gate structures 148, 150 as an implantation mask and subsequent thermal annealing. The conductivity-determining impurity type of the implanted ions used for the source/drain regions 152, 154 is of a conductivity type that is different from the conductivity type of the body regions 144, 146, as will be appreciated in the art. It will be appreciated that although not illustrated by FIG. 7, in some embodiments, one or more spacers may be formed about the sidewalls of the gate structure 148, 150 prior to the ion implantation steps to define or otherwise control the lateral extent of the source/drain regions 152, 154 in a conventional manner.

Fabrication of the semiconductor device structure 100 may be completed using well known final process steps, such as deep ion implantation, thermal annealing, formation of conductive contacts overlying the source/drain regions and/or gate structure, formation of MOS capacitors and/or other elements on the large active region 112, and/or other back end process steps, which will not be described in detail herein. By virtue of the hydrofluoric acid resistant caps 132, 134, the isolation regions 104, 106 are not reduced in thickness during subsequent process steps, for example, when hydrofluoric-acid comprising etchants are subsequently used to remove or pattern oxide material or otherwise clean the surface of the semiconductor substrate. In this regard, hydrofluoric-acid comprising etchants may be used without removing or otherwise damaging the oxide material 118, 120 of the isolation regions 104, 106. The nitride material 124 remains intact along the periphery of the active regions 108, 110, 112 thereby reducing parasitic leakage currents and/or reducing the threshold voltage (Vt) to device width (W) variations that may otherwise result from corner devices that may be created when the gate stack overlaps onto a recessed oxide isolation region. At the same time, the trenches for the isolation regions are primarily occupied by oxide material 118, 120 to provide or otherwise maintain reduced parasitic capacitances between active regions 108, 110, 112. Additionally, the distance between the upper surfaces of the hydrofluoric acid resistant caps 132, 134 and the upper surfaces of the semiconductor material 102 of the active regions 108, 110, 112 may be made relatively small (e.g., 15 nm or less), such that the semiconductor device structure 100 has a substantially planar surface prior to forming the gate structures 148, 150, which in turn, improves fine geometry photoresist processing where planar surfaces are desired.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device on a semiconductor substrate comprising a semiconductor material, the method comprising:
   forming an isolation region in the semiconductor substrate, the isolation region being recessed relative to a first region of the semiconductor material adjacent to the isolation region, the isolation region comprising a first dielectric material;
   forming a first layer of a second dielectric material overlying the isolation region and the first region, the second dielectric material being more resistant to an etchant than the first dielectric material;
   removing the second dielectric material overlying the first region leaving portions of the second dielectric material overlying the isolation region intact; and
   forming a second layer of a third dielectric material overlying the isolation region and the first region prior to forming the first layer, the first layer overlying the second layer, and wherein removing the second dielectric material comprises planarizing the first layer to obtain a planar surface aligned with portions of the second layer overlying the first region laterally adjacent to the isolation region.

2. The method of claim 1, wherein forming the isolation region comprises forming an oxide material in a trench adjacent to the first region, the second dielectric material being more resistant to hydrofluoric acid-comprising etchants than the oxide material.

3. The method of claim 1, wherein:
   forming the second layer comprises conformably depositing the third dielectric material overlying the isolation region and the first region; and
   forming the first layer comprises conformably depositing the second dielectric material overlying the third dielectric material.

4. The method of claim 3, the isolation region being recessed relative to the first region by a first distance, wherein conformably depositing the second dielectric material comprises depositing the second dielectric material to a first thickness greater than the first distance.

5. The method of claim 4, wherein conformably depositing the third dielectric material comprises depositing the third dielectric material to a second thickness less than the first distance.

6. The method of claim 1, the isolation region being recessed relative to the first region by a first distance, wherein;
   forming the second layer comprises forming the second layer having a first thickness less than the first distance; and
   forming the first layer comprises forming the first layer having a second thickness greater than the first distance.

7. The method of claim 6, wherein:
   forming the second layer comprises conformably depositing an oxide material overlying the isolation region and the first region; and
   forming the first layer comprises conformably depositing a nitride material overlying the oxide material.

8. The method of claim 7, wherein removing the second dielectric material comprises polishing the nitride material until the oxide material overlying the first region is exposed.

9. The method of claim 7, wherein removing the second dielectric material comprises removing portions of the nitride material to obtain a planar surface aligned with the oxide material overlying the first region.

10. The method of claim 1, further comprising:
    removing the third dielectric material overlying the first region; and
    forming a transistor structure on the first region.

11. A method of fabricating a semiconductor device on a semiconductor substrate comprising a semiconductor material, the method comprising:

forming an oxide isolation region adjacent to a first region of the semiconductor material, the oxide isolation region being recessed relative to the first region;

conformably depositing a nitride material overlying the first region and the oxide isolation region;

removing the nitride material overlying the first region leaving a portion of the nitride material overlying the oxide isolation region intact; and conformably depositing an oxide material overlying the first region and the oxide isolation region prior to conformably depositing the nitride material, and wherein removing the nitride material comprises planarizing the nitride material to obtain a planar surface aligned with the oxide material overlying the first region laterally adjacent to the oxide isolation region.

12. The method of claim 11, wherein removing the nitride material comprises polishing the nitride material until the oxide material is exposed.

13. The method of claim 11, the oxide isolation region being recessed relative to the first region by a first distance, wherein:

conformably depositing the oxide material comprises depositing the oxide material to a first thickness less than the first distance; and conformably depositing the nitride material comprises depositing the nitride material to a second thickness greater than the first distance.

\* \* \* \* \*